METHOD OF PARAMETER STABILIZATION OF SEMICONDUCTOR DEVICES
Filed Oct. 24, 1957
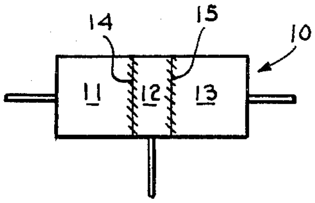
Fig. 1.
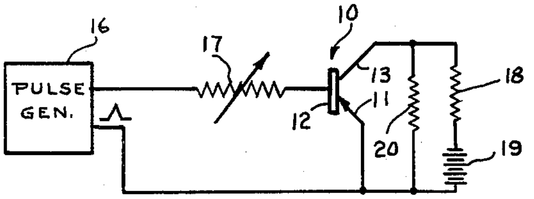
Fig. 2.
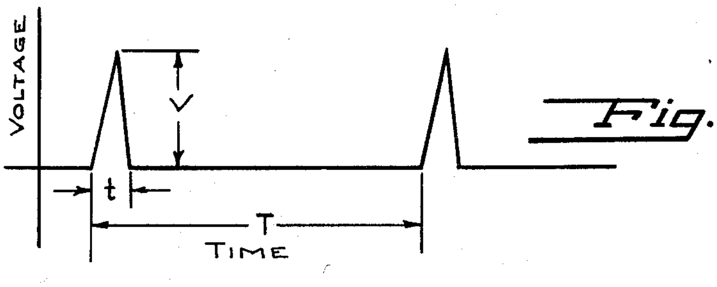
Fig. 3.
Fig. 5.
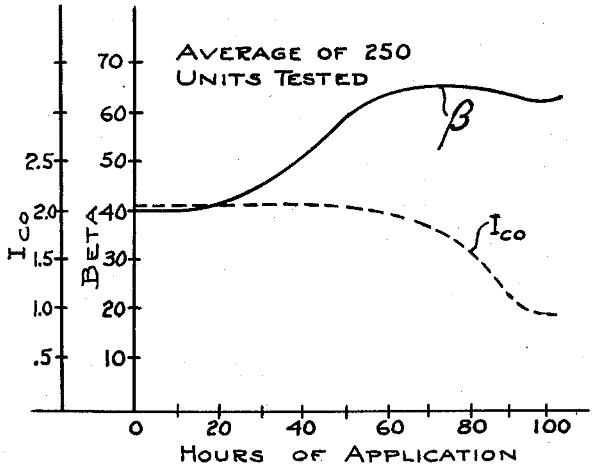
Fig. 4.
Fig. 6.
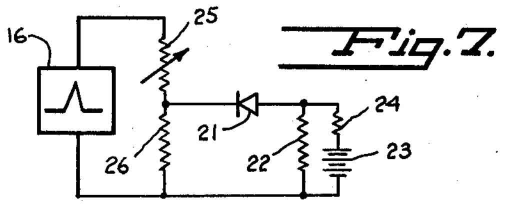
INVENTOR.
WALTER S. MILLER
BY Raymond A. Paquin
ATTORNEY.

United States Patent Office 2,922,215

Patented Jan. 26, 1960

2,922,215

METHOD OF PARAMETER STABILIZATION OF SEMICONDUCTOR DEVICES

Walter S. Miller, Elmont, N.Y., assignor to American Bosch Arma Corporation, a corporation of New York Application October 24, 1957, Serial No. 692,146

8 Claims. (Cl. 29—25.3)

The present invention relates to semi-conductor devices and has particular reference to improvement of the reliability thereof.

In present day transistor or semi-conductor production techniques, one of the final steps is the inspection or test for certain characteristics, usually made on a "go-or-no-go" basis. The "go-or-no-go" acceptance tests evidently define a more or less broad distribution of parameters and characteristics, resulting in semi-conductor devices having widely varying properties although normally classified alike.

In order to cope with the spread in the characteristics of the semi-conductor devices, it has been necessary for the end equipment manufacturer to perform the additional chore of selection in circuit, thereby assuring acceptance only by observed performance.

It is a purpose of the present invention to reduce the spread in the characteristics of semi-conductor devices to a narrow band thereby eliminating the requirement of selection prior to insertion in the end equipment. Furthermore the characteristics of individual components are improved by increased current gain values and decreased leakage current values. Another advantage of this process is found in the reclaiming of previously unacceptable production to thereby increase the yield during manufacture of the semi-conductors.

In accordance with the present invention, these purposes are accomplished by subjecting the semi-conductor to a treatment comprising an application of high power pulses of short duration at a relatively slow rate over a relatively long period of time. The pulses cause a dissipation of power across the junction area of the semi-conductor and it appears that the generation of heat during this operation, although very little, causes a reforming of the space charge area and tends to stabilize the semi-conductor characteristics. There may be other effects, as well as the thermal effect, which contribute to the stabilization of the semi-conductor but the nature of these other effects is not readily understood nor explained. It appears to involve a reforming of the molecular structure in the space charge area, or the junction areas between the semi-conducting bodies. For example, the continued switching action as the transistor is turned on and off at each pulse may be effective in producing the beneficial results observed. The net result theoretically is the reduction of the space charge area and the stabilization of the surface recombination velocity. The aperiodic heat generated across the junction apparently causes a better dispersion of alloying material and reduces the leakage of the diodes.

A special "forming" technique has been in prior use exclusively in making point contact transistors. In these prior methods, the forming pulse is applied only once between the base and either the collector or emitter terminal, depending on whether the unit is an N-type or a P-type device. In tailoring the transistor characteristics, several shots of increasing magnitude may be applied before the one of desired magnitude is reached. Measurement of the characteristics after each shot must be made to insure proper forming.

In contrast to the prior art method and purpose, the present invention is used primarily for stabilization of junction type transistors and semi-conductors. The so called forming voltage in this instance is a series of peaked pulses, the nature of which depends on the type of semi-conductor device being treated and the desired characteristics thereof. The shape of the pulse is particularly important to successful operation and preferably resembles a triangular wave sharply increasing to a maximum and then sharply dropping to zero. The maximum instantaneous power dissipation is approximately five times the rated value but the length of time the power is applied is extremely short, not more than ten microseconds. The repetition rate of the power pulse is about six times per second, although satisfactory results have been obtained by using repetition rates from two to thirty pulses per second. The pulses are applied over a relatively long period of time which may be in the nature of several days or more.

For a more complete understanding of the invention, reference may be had to the accompanying diagrams, in which:

Fig. 1 illustrates a junction transistor;

Fig. 2 shows the circuit for applying the present treatment;

Fig. 3 represents the pulse used in the circuit of Fig. 2;

Fig. 4 is a graph showing the change in certain parameters after treatment;

Fig. 5 is a modification of Fig. 3;

Fig. 6 is a further modification of Fig. 3; and

Fig. 7 shows a circuit for applying the treatment to a semi-conductor diode.

Referring now to Fig. 1 of the drawings, a junction transistor 10 of the PNP type includes emitter and collector area 11 and 13 respectively of P-type material, sandwiching a base area 12 of N-type material. At the surfaces 14, 15 between the base and the emitter and collector respectively there exists a space charge region which is denoted by the shading. It is this space charge area which is reformed during the treatment to be described resulting in a transistor of improved reliability and operating characteristics. An analogous change occurs in other semi-conducting devices such as diodes, for example, to which the treatment is given.

Fig. 2 shows a typical common emitter circuit which is used for the application of the treatment to a transistor 10 which is maintained in a saturated state. The output of a pulse generator 16 is applied directly across the base 12 and emitter 11 of the transistor 10, preferably through a variable resistor 17 introduced in the circuit for current limiting purposes. The collector 13 is connected to the common emitter 11 through the current limiting resistor 18 and collector bias supply 19. A load resistor 20 may be connected between the collector 13 and emitter 11, if necessary.

It will be noted that the pulse is applied between the base and the emitter of transistor having the collector circuit biased, but without bias in the emitter circuit. This situation holds for either the NPN or PNP type of unit. The pulse is never applied between the collector and base. The polarity of the pulse and the collector bias, must be selected to permit current flow through the transistor.

The shape of the pulse output of generator 16 resembles that shown in Fig. 3, a modified sawtoothed wave having a period T and a pulse duration $t$, where $t$ is much less than $T_1$. The voltage of the pulse increases linearly and sharply from zero to the maximum, V, and then nearly instantaneously drops to zero. In a typical example, $t$ is about ten microseconds, T about 160 milliseconds (six cycles/second) and V is sufficient to create an instantaneous power dissipation of approximately five times the rated power of the transistor at the base emitter junction.

The pulses are applied for a relatively long period of time (which may be from about one to five days), depending on the chosen values of $t$, T and V. If the treatment is ended too soon, the beneficial effects resulting therefrom will be temporary and will disappear after a short time. If the treatment is continued for an extremely long time, there will be no evident additional improvement in the transistor characteristics over that reached after a certain lesser period of treatment.

It will be realized that each of the treatment parameters specified above will have values between certain limits and the typical values mentioned are merely illustrative. Thus, the pulse repetition rate may be anything between two and thirty cycles per second, with T varying accordingly. A pulse rate outside of these limits will not produce the desired results. The value of $t$ is normally not greater than ten microseconds in order to retain the effect of an instantaneous application and removal of the signal and to preclude too much of a temperature rise at the junction 14. The chosen value of V may be selected so as to give a substantially higher than rated dissipation at junction 14, and the power dissipation need not be limited to the 500 percent value suggested in the typical example. In any event, it may be stated that the treatment consists in the application of a series of relatively intense electrical pulses of extremely short duration and long period between the emitter and base over a relatively long time. The period between the pulses is several thousand times the duration of the pulse.

The treatment results in stabilization of current gain, collector leakage current and the resistive and capacitive parameters of the transistor. Fig. 4 shows typical experimental results in which the average of beta for two hundred fifty transistors and the average $I_{co}$ for the same transistors is plotted against the hours of application of the treatment through one hundred hours of application. It will be seen in Fig. 4 that $\beta$ increases during the initial stages of treatment while $I_{co}$ decreases during continued application of the treatment. However, these experimental results are too meager to predict that $\beta$ is affected only by the early treatment and $I_{co}$ is affected after $\beta$ has become stabilized.

On the other hand, experimental results (not tabulated here) have substantiated the fact that the hybrid parameters ($R_{11}$, $R_{12}$, $R_{21}$, $R_{22}$) are stabilized, and that the collector capacitance, base resistance and emitter resistance are stabilized at a lower value than the initial.

The length of application of the treatment in Fig. 4 is probably a function of the maximum value of the pulse, the period between pulses and the duration of the pulse. For Fig. 4, the voltage used was twenty volts peak-to-peak, the pulse duration was about six microseconds and the pulse was repeated six times per second. Judicious choice of these variables may permit shorter treatment time.

In certain modifications of the basic treatment, other predicted results may be obtained. For example, if only $\beta$ is to be increased while $cc$ and $I_{co}$ are to remain substantially unaffected, the shape of the pulse may be such as shown in Fig. 5, where the voltage increases nearly instantaneously to a maximum and then decreases linearly to zero. The duration of the pulse is again small compared to the period of the repetition cycle. In the case of power transistors, stabilization may be effected by using a rectangular pulse as shown in Fig. 6 of somewhat longer duration than the pulse of Figs. 3 or 5, but still extremely short compared to the period of repetition.

The treatment is not limited to transistors alone and other semi-conducting devices, such as diodes for example, can benefit from this treatment. Fig. 7 illustrates a circuit which may be used for treating semi-conductor diodes. The pulse generator 16 output is adjusted by a voltage divider which includes variable resistor 25 and fixed resistor 26. The semi-conductor diode 21 being treated is connected in series with a fixed resistor 22 across the resistor 20. Bias current is applied to the diode 21 from the bias supply 23 through resistor 24.

I claim:

1. The method of stabilizing the characteristics of a transistor comprising, applying a series of substantially equal pulses to the transistor between the base and emitter of the transistor, with each pulse having a sharp rise time and a sharp fall time, with the duration of each pulse being shorter than the time between successive pulses.

2. The method of stabilizing the characteristics of a transistor comprising, applying a series of substantially equal pulses to the transistor between the base and emitter of the transistor, with each pulse having a sharp rise time and a sharp fall time, with the duration of each pulse being shorter than the time between successive pulses, said pulses being applied to the transistor for a period of at least twenty-four hours.

3. The method of stabilizing the characteristics of a transistor comprising, applying a series of substantially equal pulses of sawtooth wave form between the base and emitter of the transistor with each pulse having a sharp rise time and a sharp fall time, with the duration of each pulse being shorter than the time between successive pulses, the maximum value of each pulse being such that the maximum power dissipated is greater than the rated value of the power dissipation of the transistor.

4. The method of stabilizing the characteristics of a semiconductor comprising, applying a series of substantially equal pulses to the semiconductor with each pulse having a sharp rise time and a sharp fall time, with the duration of each pulse being shorter than the time between successive pulses.

5. The method of stabilizing the characteristics of a semiconductor comprising, applying a series of substantially equal pulses to the semiconductor with each pulse having a sharp rise time and a sharp fall time, with the duration of each pulse being shorter than the time between successive pulses, said pulses being applied to the semiconductor for a period of at least twenty-four hours.

6. The method of stabilizing the characteristics of a semiconductor comprising, applying a series of substantially equal pulses of sawtooth wave form to the semiconductor with each pulse having a sharp rise time and a sharp fall time, with the duration of each pulse being shorter than the time between successive pulses.

7. The method of stabilizing the characteristics of a semiconductor comprising, applying a series of substantially equal pulses of sawtooth wave form to the semiconductor with each pulse having a sharp rise time and a sharp fall time, with the duration of each pulse being shorter than the time between successive pulses, said pulses being applied to the semiconductor for a period of at least twenty-four hours.

8. The method of stabilizing the characteristics of a semiconductor comprising, applying a series of substantially equal pulses of sawtooth wave form to the semiconductor with each pulse having a sharp rise time and a sharp fall time, with the duration of each pulse being shorter than the time between successive pulses, the maximum value of each pulse being such that the maximum power dissipated is greater than the rated value of the power dissipation of the semiconductor.

References Cited in the file of this patent

UNITED STATES PATENTS 2,755,536 Dickinson ............ July 24, 1956